United States Patent [19]
Yoshida et al.

[11] Patent Number: 5,828,081
[45] Date of Patent: Oct. 27, 1998

[54] INTEGRATED SEMICONDUCTOR DEVICE

[75] Inventors: Kazuhiko Yoshida; Tatsuhiko Fujihira, both of Nagano, Japan

[73] Assignee: Fuji Electric Co., Ltd., Japan

[21] Appl. No.: 759,177

[22] Filed: Dec. 4, 1996

Related U.S. Application Data

[63] Continuation of Ser. No. 391,694, Feb. 16, 1995, abandoned.

[30] Foreign Application Priority Data

Feb. 17, 1994 [JP] Japan ................... 6-020059
May 27, 1994 [JP] Japan ................... 6-113249

[51] Int. Cl.$^6$ ................... H01L 23/58; H01L 29/76; H01L 29/00
[52] U.S. Cl. ................... 257/48; 257/328; 257/337; 257/529; 257/536; 257/538
[58] Field of Search ................... 257/328, 337, 257/368, 48, 529, 536, 538, 351, 603

[56] References Cited

U.S. PATENT DOCUMENTS

| | | | |
|---|---|---|---|
| 4,339,710 | 7/1982 | Hapke | 324/73 |
| 4,974,059 | 11/1990 | Kinzer | 357/23.4 |
| 5,008,725 | 4/1991 | Lidow et al. | 357/23.4 |
| 5,130,767 | 7/1992 | Lidow et al. | 357/23.4 |
| 5,393,991 | 2/1995 | Kawakami | 257/48 |
| 5,418,383 | 5/1995 | Takagi et al. | 257/48 |

OTHER PUBLICATIONS

Conf. Rec. IEEE Ind. Appl. Soc. Ann. Meeting, pp. 429–433 (1986) Glogolija et al.
Electro–Mini/Micro Northeast Conf. Rec. No. 13/5 (1986) R. K. Franke et al., pp. 1–3.

IEEE 1987 Custom Integrated Circuit Conf., pp. 443–446 (1987), Y. Ohta et al.

IEEE Trans. Electron Devices, vol. 37 No. 7, pp. 1643–1650 (1990), R. Moazzami et al.

Proc. Reliability Physics Symp., pp. 1–7 (1979), D. L. Crock.

IEEE 1990 Custom Integrated Circuit Conf., 19.2.1–19.2.4 (1990), R. J. Straub.

"Comparison of Ultralow Specific ON–Resistance UMOS-FET Structures: The ACCUFET, EXTFET, INVET, and Conventional UMOSFET's", by Syau et al., IEEE Transactions on Electron Devices, vol., 41, No. 5, May 1994.

*Primary Examiner*—Steven H. Loke
*Attorney, Agent, or Firm*—Rossi & Associates

[57] ABSTRACT

A power IC is provided which facilitates applying a high voltage to the gate electrode of the MOS semiconductor element for the power output of the power IC to break down defects around the gate oxide film in a short time thereby screening the power ICs efficiently. A gate terminal for testing is led out from the gate electrode of the MOS type semiconductor element for the power output of the power and the screening test is conducted by applying a high voltage to the gate terminal for testing. The expected bad influence of the applied high voltage on the control circuit is avoided by the level shift means or the switching means switched off only during the screening test and short-circuited after the test is over.

6 Claims, 6 Drawing Sheets

INTEGRATED SEMICONDUCTOR DEVICE

This is a continuation of application Ser. No. 08/391,694 filed Feb. 16, 1995, now abandoned.

FIELD OF THE INVENTION

The present invention relates to an integrated semiconductor device (hereinafter referred to as "IC"), in which a MOS semiconductor element for the power output of the IC and a control circuit are integrated on a semiconductor substrate.

BACKGROUND OF THE INVENTION

Power ICs, in which MOS semiconductor elements such as a power MOSFET, an insulated gate bipolar transistor (IGBT), etc. are used for power output, have been recently developed. So-called screening, which eliminates defective elements by inspecting chips immediately after the wafer process on the chips is completed, is conducted for improving reliability of the semiconductor devices. FIG. 2 is a sectional view showing a power MOSFET. A gate screening test is conducted on the individual power MOSFET in its chip stage to detect potential defective elements and so as not to transfer the potential defective elements to successive manufacturing steps. In FIG. 2, an N⁻ layer 11 is formed on an N⁺ substrate 12; a P⁻ well 13 is formed in a surface layer of the N⁻ layer 11; and an N⁺ source region 14 is formed in a surface layer of the P⁻ well 13. A polycrystalline silicon gate electrode 16 is formed through a gate oxide film 15 on an area between the source region 14 of the P⁻ well 13 and an exposed portion of the N⁻ layer 11. A gate pad electrode 18 contacts with the gate electrode 16 on a thick field oxide film 17. A source electrode 21, isolated by an interlayer insulation film 19 from the gate electrode 16, contacts in common with a deep P⁺ well 20 formed in a central part of the P⁻ well 13 and the source region 14, and a drain electrode 22 contacts with the N+ substrate 12. FIG. 3 is a diagram showing an upper chip surface of the MOSFET or the IGBT, in which an S (E) terminal (or a pad), connected to the source electrode 21 (an emitter electrode in the IGBT), and a G terminal (or a pad), connected with the gate pad electrode 18, are disposed on a chip 23.

FIG. 4 is a chart showing the distribution of the breakdown voltage $BV_{GSS}$ of the MOSFET when a voltage is applied across the gate terminal G and the source terminal S. The gate screening test is a test which breaks defective portions of the P⁻ well 13, gate electrode 16, and the interlayer insulation film 19 as well as the gate oxide film 15 of the elements distributing in a and b of FIG. 4 by applying, as shown in FIG. 5, a voltage d between c and b of $BV_{GSS}$ of FIG. 4 for a period of time $t_1$ across the gate electrode G and the source electrode S. FIG. 6 is a chart showing the relations between the time t necessary for breaking the defective portion and the junction temperature Tj of the chip with the applied voltage d as a parameter. FIG. 6 shows that the defects which have a defective portion around their gate electrode can be eliminated in a shorter time and at lower junction temperature as the applied voltage d increases from e to g via f below c.

In a usual power IC of the type illustrated in FIG. 7, a signal processing circuit 3 and a driving/detecting/protecting circuit 4 of a control circuit portion 2, having a withstand voltage lower than that of the power portion, are connected with the gate of the power MOSFET 1 having the structure shown in FIG. 2. The source terminal S is led out from the source electrode 19 and the drain terminal D from the drain electrode 21 of the power MOSFET 1 shown in FIG. 2. Low power terminals $V_1$ and $V_2$ are led out from the signal processing circuit 3 and low power terminals $V_3$, $V_4$, $V_5$ and $V_6$ from the driving/detecting/protecting circuit 4. FIG. 8 shows an upper surface of such a power IC that explained above, in which the S terminal of the MOSFET (the emitter terminal E of the IGBT) is disposed on a power portion 25 of a chip 24, and the low power terminals $V_1$, $V_2$, $V_3$, $V_4$, $V_5$ and $V_6$ are disposed on a control circuit portion 26 of the chip 24. In the power IC, a voltage as high as d of FIG. 5 is not applied, in the usual operation, to the gate electrode of the MOS power semiconductor element. In most cases, a voltage as low as, for example, the CMOS level or the TTL level is applied to the gate electrode of the MOS power semiconductor element. Therefore, the gate voltage should be applied at high temperature for long time, as shown by e of FIG. 6, for eliminating defective elements, which have a defect around the gate oxide film of the MOS power semiconductor element such as the MOSFET 1, through the aging test reported by M. Simaya et al. in The Technical Report of the Institute of Electronics, Information and Communication (Jpn.) SSD 85-19, pp45–56 (1985) or through the burn-in test reported by K. Furutani et al. in The Transactions of the Institute of Electronics, Information and Communication (Jpn.) C-II, Vol. J73-C-11, No. 5, pp302–309 (1990).

In view of the foregoing, an object of the present invention is to provide a power IC which facilitates eliminating defective elements, which have a defect around the gate oxide film of a MOS power semiconductor element with high withstand voltage, by a test at low chip temperature in a short time.

SUMMARY

The object of the present invention is achieved by an integrated semiconductor device which is comprised of a control circuit, a MOS semiconductor element integrated with the control circuit on a semiconductor substrate that includes a gate electrode connected to the control circuit, and a gate terminal for applying a test voltage. It is preferable to insert a voltage level shift means between the control circuit and the gate electrode of the MOS semiconductor element. It is effective to use for the level shift means a resistor, a resistor and a voltage regulation diode connected between an end of the resistor on the side of the control circuit and a main electrode of the MOS semiconductor element, or a means for sharing a voltage applied to the gate electrode of the MOS semiconductor element and a switching means for cutting off a connection between the gate electrode of the MOS semiconductor element and the control circuit when the shared voltage exceeds a predetermined value. It is also preferable to insert a switching means between the gate electrode of the MOS semiconductor element and the control circuit for substantially cutting off a connection between the gate electrode of the MOS semiconductor element and the control circuit only when a voltage is applied to the gate terminal for testing. It is effective to use for the switching means a fuse, a diode or a resistor.

Since the gate terminal for testing, connected with the gate electrode of the MOS semiconductor element for the power output of the power IC, facilitates applying a high gate voltage to the gate electrode of the power output element, defective portions around the gate oxide film is broken down in a time as short as and at a substrate temperature as low as the time and the temperature for testing the individual element and the screening test is conducted with high efficiency. When the applied high voltage is expected to cause bad influence on the control circuit, the bad influence is avoided by the level shift means or the switching means switched off only during the screening test.

BRIEF DESCRIPTION OF THE DRAWINGS

The invention will be described in detail with reference to certain preferred embodiments and the accompanying drawings, wherein.

DETAILED DESCRIPTION OF THE PREFERRED EMBODIMENTS

Now the present invention will be described in detail hereinafter with accompanied drawings which illustrate the preferred embodiments of the present invention.

Figure 1:
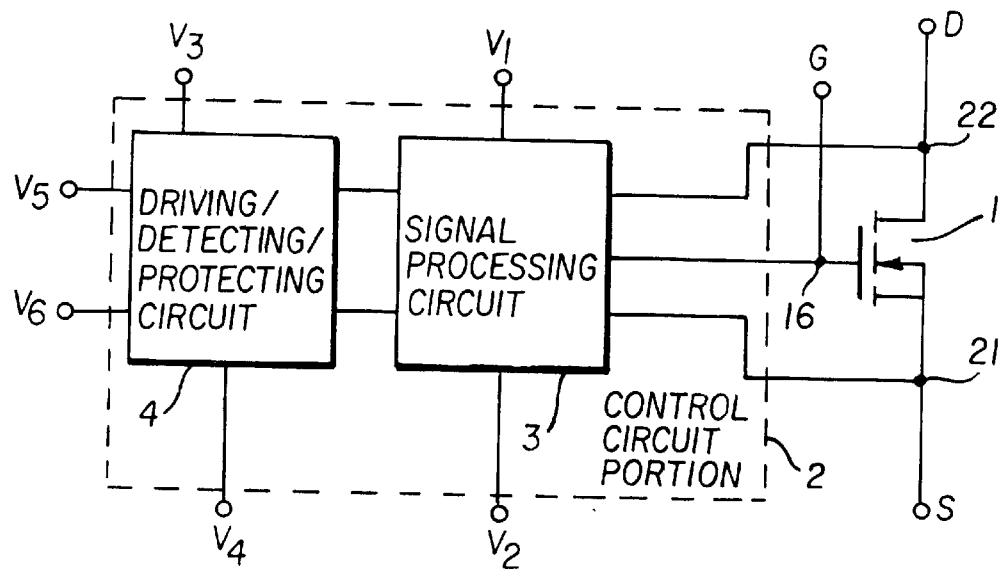
FIG. 1 is a circuit block diagram of an embodiment of the power IC according to the present invention.
Figure 2:
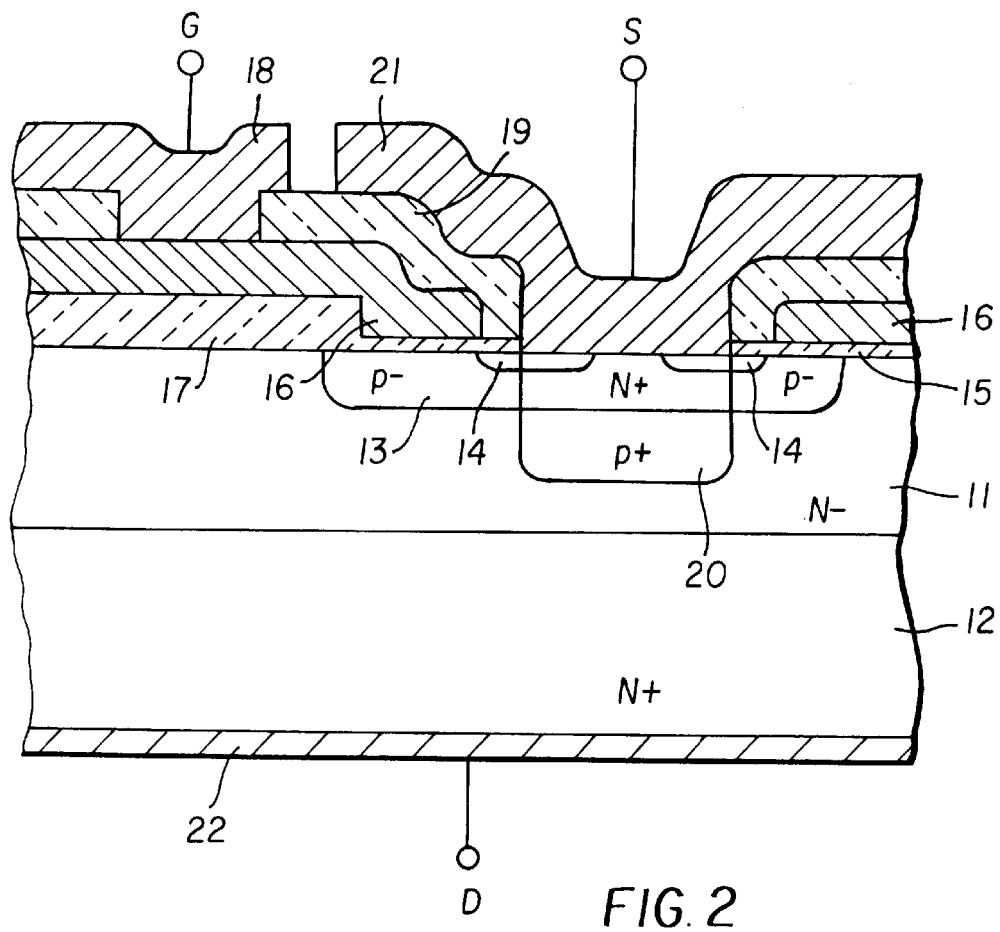
FIG. 2 is a sectional view showing a power MOSFET used for power output of the power IC.
Figure 3:
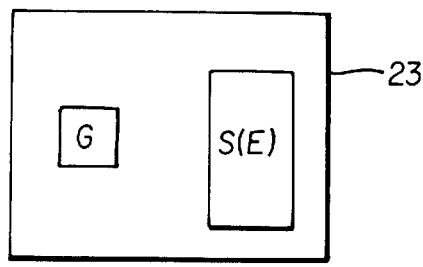
FIG. 3 is a diagram showing an upper chip surface of the individual MOSFET according to the prior art.
Figure 4:
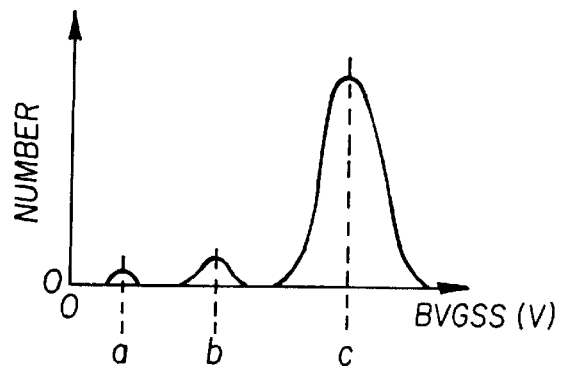
FIG. 4 is a chart showing the distribution of the voltage at which the gate oxide film of the power MOSFET is broken down.
Figure 5:
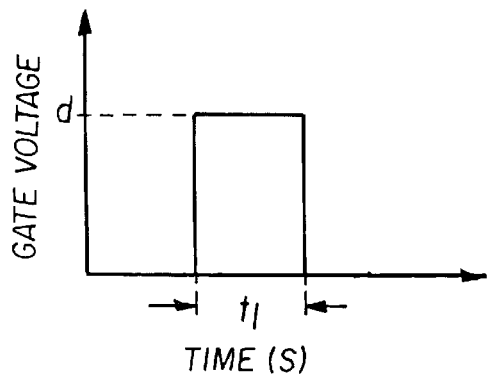
FIG. 5 is a wave chart of the applied voltage for the screening test of the power MOSFET.
Figure 6:
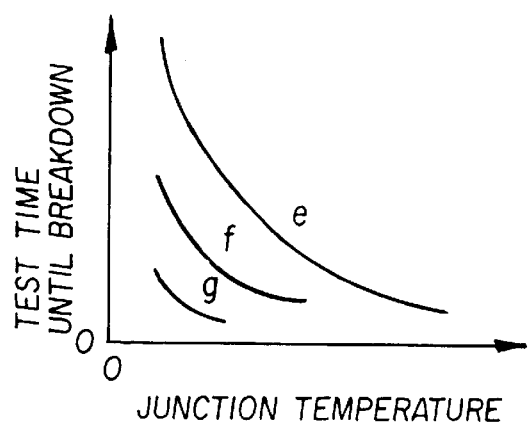
FIG. 6 is a chart showing the relations between the time necessary for breaking the defective portion and the junction temperature with the applied voltage as a parameter.
Figure 7:
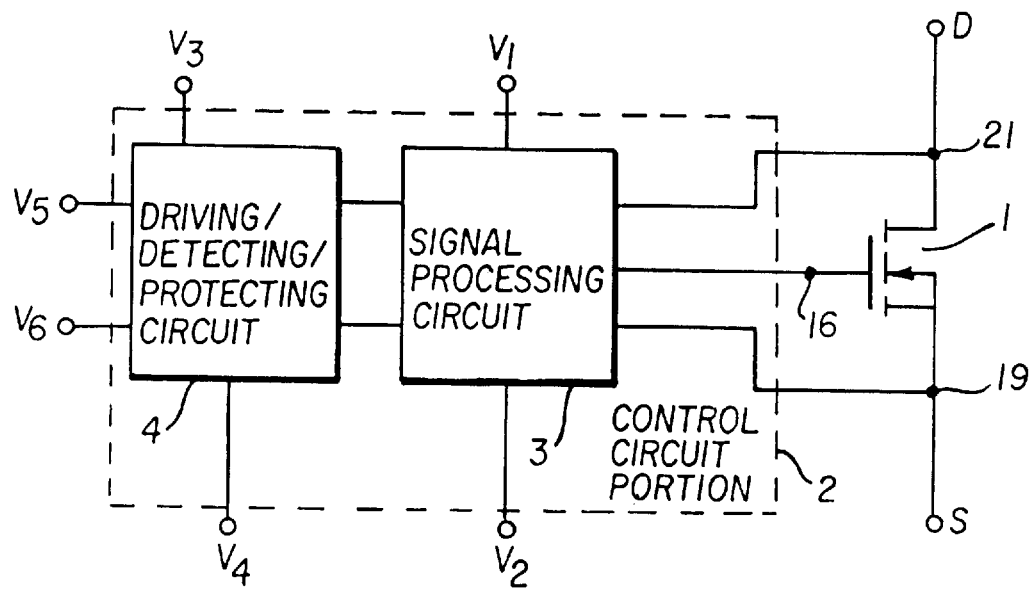
FIG. 7 is a circuit block diagram of the power IC according to the prior art.
Figure 8:
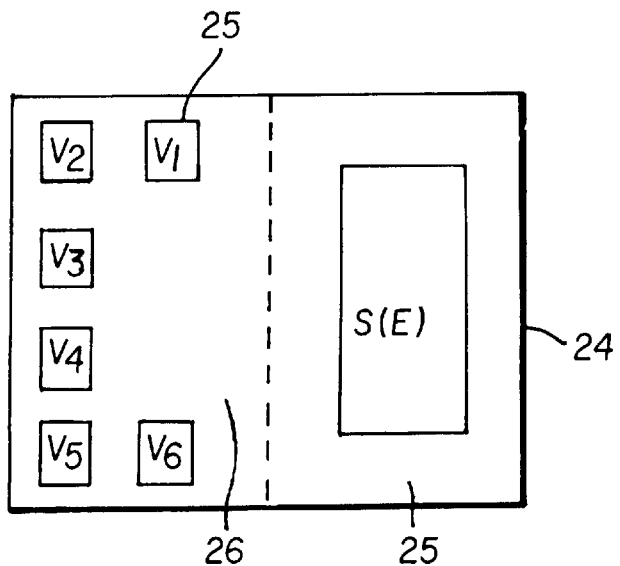
FIG. 8 is a diagram showing an upper chip surface of the power IC according to the prior art.
Figure 9:
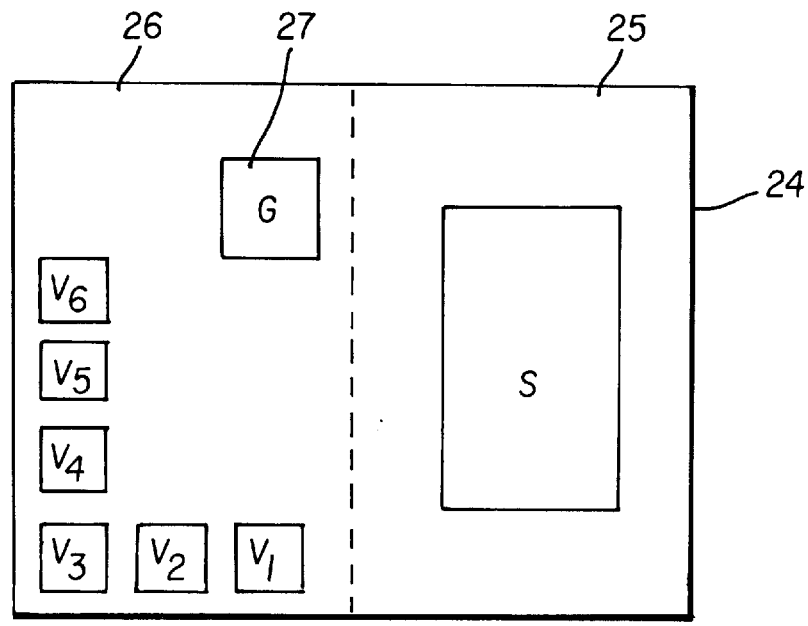
FIG. 9 is a diagram showing an upper chip surface of an embodiment of the power IC according to the present invention.
Figure 10:
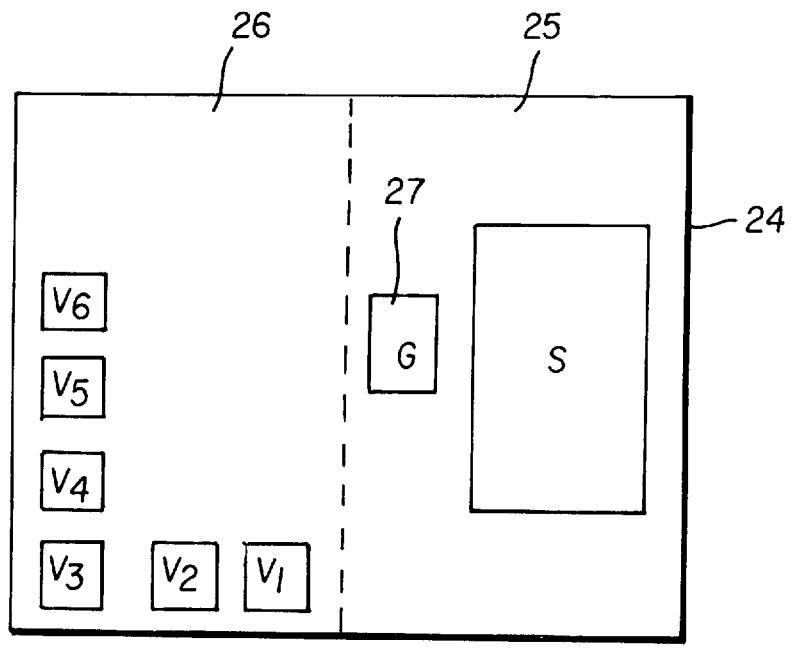
FIG. 10 is a diagram showing an upper chip surface of another embodiment of the power IC according to the present invention.

FIG. 1 is circuit block diagram of an embodiment of the IC according to the present invention, in which the same constituents with those of FIG. 7 are designated by the same reference numerals. In this power IC, a gate test terminal G is connected to the gate electrode 16 of the power MOSFET 1. FIGS. 9 and 10 show upper chip surfaces of the IC, in which the same constituents with those of FIG. 8 are designated by the same reference numerals. In FIG. 9, a G terminal 27 is disposed on the control circuit portion 26, and the G terminal 27 is disposed on the power portion 25 in FIG. 10. The G terminal 27 is used in a gate screening test for applying a high voltage d in the same way as in screening the individual power MOSFET shown in FIG. 3.

Figure 11:
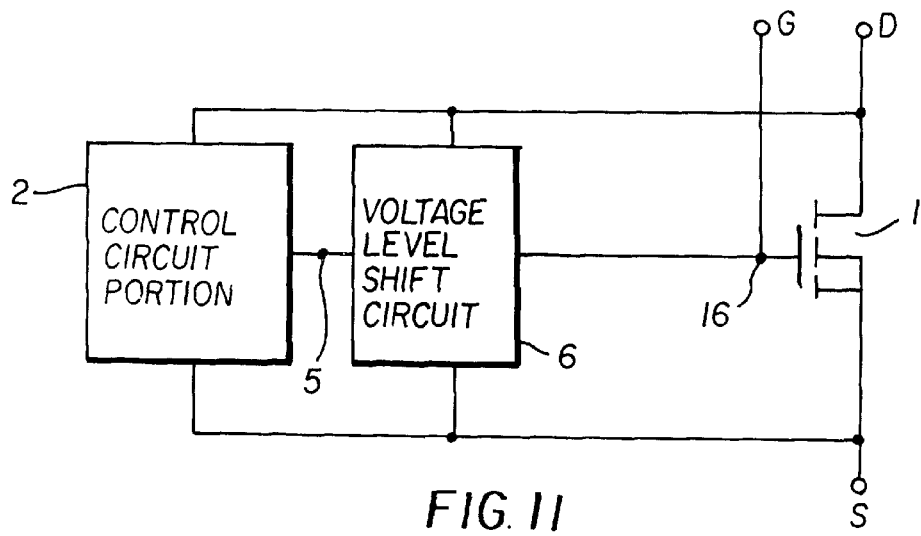
FIG. 11 is a circuit block diagram of another embodiment of the power IC according to the present invention.
Figure 12:
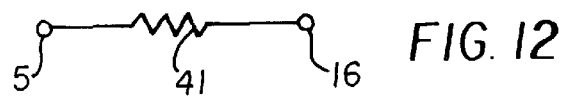
FIG. 12 is a circuit diagram showing an example of the voltage level shift circuit of the power IC of FIG. 11.
Figure 13:
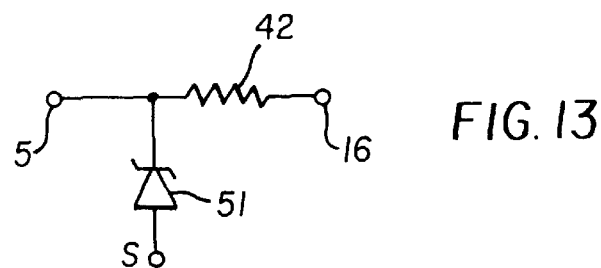
FIG. 13 is a circuit diagram showing another example of the voltage level shift circuit of the power IC of FIG. 11.
Figure 14:
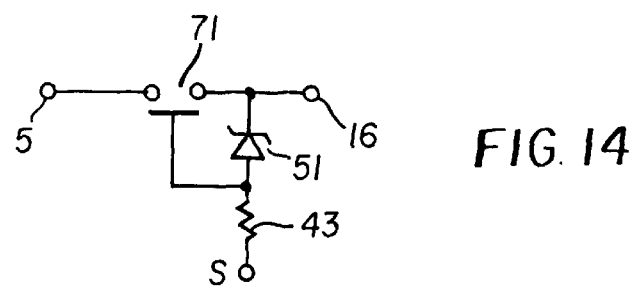
FIG. 14 is a circuit diagram showing still another example of the voltage level shift circuit of the power IC of FIG. 11.
Figure 15:
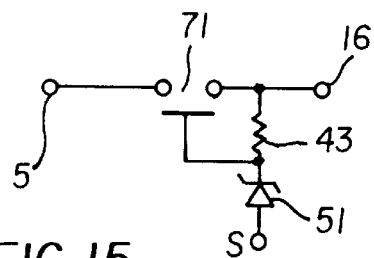
FIG. 15 is a circuit diagram showing the other example of the voltage level shift circuit of the power IC of FIG. 11.

However, when a high voltage is applied in the gate screening test, the control circuit portion 2 connected with the gate electrode may sometimes break down. An embodiment shown in FIG. 11 applies the high voltage only to the power portion by disposing a level shift circuit 6 which shifts the level of the gate shock voltage d between an internal gate terminal 5 of the control circuit portion 2, which may sometime break down, and the gate electrode 16 of the MOSFET 1. For the level shift circuit 6, a circuit shown in FIG. 12, which shares the voltage with a resistor 41 comprised of a diffused resistor formed in a semiconductor substrate or with a resistive member deposited on a substrate, is used. Alternatively, a circuit is used as shown in FIG. 13 which keeps the voltage on the side of the control circuit at a constant value with a voltage regulation diode 51 which is comprised of a PN junction formed by diffusion in a semiconductor substrate or a PN junction of a polycrystalline silicon deposited on a semiconductor substrate and shares the voltage with a resistor 42 formed in the same way as the resistor 41. Still further variations are possible. For example, a circuit, which is comprised of a resistor 43 connected to the diode 51 as shown in FIG. 14, across which a voltage is generated when a voltage exceeding the Zener voltage of the diode 51 is applied and boosts the impedance between the internal gate terminal 5 and the gate electrode 16 high by switching off a normally ON switching element 71 by the generated voltage can be employed, or a circuit, shown in FIG. 15, in which the resistor 43 and the diode 51 are connected in the reverse order of the circuit of FIG. 14, is used. Thus, various level shift circuits which lower the voltage at the internal gate terminal on the side of the control circuit are used in the ICs for the gate screening test.

Figure 19:
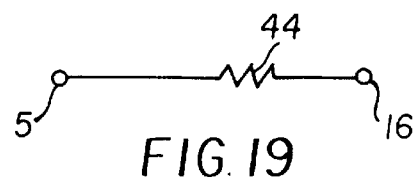
FIG. 19 is a circuit diagram showing still another example of the switch of the power IC of FIG. 16.
Figure 16:
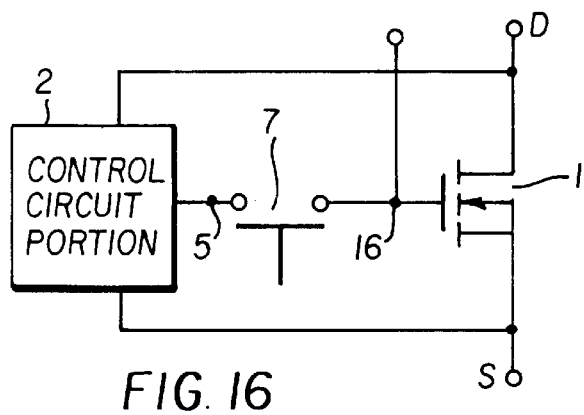
FIG. 16 is a circuit block diagram of still another embodiment of the power IC according to the present invention.
Figure 20:
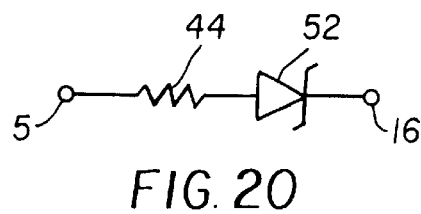
FIG. 20 is a circuit diagram showing the other example of the switch of the power IC of FIG. 16.
Figure 17:
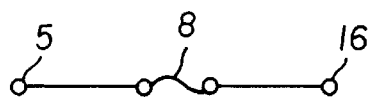
FIG. 17 is a circuit diagram showing an example of the switch of the power IC of FIG. 16.
Figure 18:
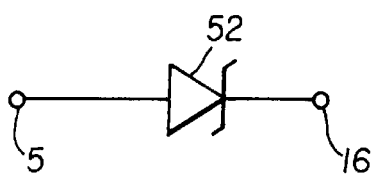
FIG. 18 is a circuit diagram showing another example of the switch of the power IC of FIG. 16.

Alternatively, the control circuit portion 2 is separated from the power MOSFET 1 during the screening test, and the control circuit portion 2 is connected again to the power MOSFET 1 after the test is over. In FIG. 16, a switch 7 disposed between the internal gate terminal 5 and the gate electrode 16 is mechanically or electrically switched off while the gate screening test is conducted. The switch 7 connects the internal gate terminal 5 and the gate electrode 16 when the IC is used. A fuse 8 shown in FIG. 17 which melts under the high voltage applied to the gate electrode 16, a diode 52 with high withstand voltage which prevents a high voltage from being applied to the internal gate terminal 5, etc. are used as the switch 7. After the gate screening test is over, the portion for the fuse 8 is connected by a conductive wire or a conductive layer, and the diode 52 of FIG. 18 is short-circuited by electrical breakdown. In an embodiment shown in FIG. 19, a resistor 44 is inserted during the screening test, and then, the internal gate terminal 5 and the gate electrode 16 are short-circuited by trimming the resistor 44. An embodiment shown in FIG. 20 combines the embodiments of FIGS. 18 and 19. It is obvious that the embodiments described above are applicable also the ICs which use an IGBT for power output.

As has been explained so far, the production efficiency of the power IC is improved by the present invention which facilitates screening the ICs at low substrate temperature in a short time by connecting a gate terminal to the gate electrode of the MOS semiconductor element for power output and by applying to the MOS semiconductor power output element a gate voltage as high as that for testing the individual element.

The invention has been described with reference to certain preferred embodiments thereof. It will be understood, however, that modifications and variations are possible within the scope of the appended claims.

What is claimed is:

1. An integrated semiconductor device comprising:

a control circuit;

a MOS semiconductor element integrated with the control circuit on a semiconductor substrate, wherein said MOS semiconductor element includes a gate electrode;

a gate terminal connected to the gate electrode; and a voltage level shift means, connected between the control circuit and the gate electrode of the MOS semiconductor element, for limiting a voltage applied to the control circuit during a screening test operation below a level of a test voltage applied to the gate terminal during the screening test operation, and for permitting bidirectional current flow between the control circuit and the gate electrode after the screening test operation;

wherein the MOS semiconductor element further comprises a source electrode, and wherein the level shift means comprises a resistor and a voltage regulation diode connected between an end of the resistor that is connected to the control circuit and the source electrode of the MOS semiconductor element.

2. An integrated semiconductor device comprising:

a control circuit;

a MOS semiconductor element integrated with the control circuit on a semiconductor substrate, wherein said MOS semiconductor element includes a gate electrode;

a gate terminal connected to the gate electrode; and a voltage level shift means, connected between the control circuit and the gate electrode of the MOS semiconductor element, for limiting a voltage applied to the control circuit during a screening test operation below a level of a test voltage applied to the gate terminal during the screening test operation, and for permitting bidirectional current flow between the control circuit and the gate electrode after the screening test operation;

wherein the level shift means comprises a means for sharing said test voltage which is applied to the gate electrode of the MOS semiconductor element via the gate terminal and a switching means for disconnecting the gate electrode of the MOS semiconductor element from the control circuit when the shared test voltage exceeds a predetermined value.

3. An integrated semiconductor device comprising:

a control circuit;

a MOS semiconductor element integrated with the control circuit on a semiconductor substrate, wherein said MOS semiconductor element includes a gate electrode;

a gate terminal connected to the gate electrode; and a switching means, coupled between the gate electrode of the MOS semiconductor element and the control circuit, for substantially preventing bidirectional current flow between the gate electrode of the MOS semiconductor element and the control circuit when a test voltage is applied to the gate terminal during a screening test operation, and for permitting bidirectional current flow between the control circuit and the gate electrode after completion of the screening test operation;

wherein the switching means comprises a reconnectable fuse link that is reconnected by a conductive line element after the screening test operation.

4. An integrated semiconductor device comprising:

a control circuit;

a MOS semiconductor element integrated with the control circuit on a semiconductor substrate, wherein said MOS semiconductor element includes a gate electrode;

a gate terminal connected to the gate electrode; and a switching means, coupled between the gate electrode of the MOS semiconductor element and the control circuit, for substantially preventing bidirectional current flow between the gate electrode of the MOS semiconductor element and the control circuit when a test voltage is applied to the gate terminal during a screening test operation, and for permitting bidirectional current flow between the control circuit and the gate electrode after completion of the screening test operation;

wherein the switching means comprises a short-circuitable diode that is short-circuited by electrical breakdown after the screening test operation.

5. An integrated semiconductor device comprising:

a control circuit;

a MOS semiconductor element integrated with the control circuit on a semiconductor substrate, wherein said MOS semiconductor element includes a gate electrode;

a gate terminal connected to the gate electrode; and a voltage level shift means, connected between the control circuit and the gate electrode of the MOS semiconductor element, for limiting a voltage applied to the control circuit during a screening test operation below a level of a test voltage applied to the gate terminal during the screening test operation, and for permitting bidirectional current flow between the control circuit and the gate electrode after the screening test operation;

wherein the level shift means comprises a resistive element and a voltage regulation diode connected between an end of the resistive element that is connected to the control circuit and a source electrode of the MOS semiconductor element.

6. The integrated semiconductor device as claimed in claim 5, wherein the resistive element is a resistor.

* * * * *